(12) United States Patent
Langhammer

(10) Patent No.: US 7,256,715 B1
(45) Date of Patent: Aug. 14, 2007

(54) DATA COMPRESSION USING DUMMY CODES

(75) Inventor: Martin Langhammer, Salisbury (GB)

(73) Assignee: Altera Corporation, San Jose, CA (US)

( * ) Notice: Subject to any disclaimer, the term of this patent is extended or adjusted under 35 U.S.C. 154(b) by 426 days.

(21) Appl. No.: 11/030,801

(22) Filed: Jan. 7, 2005

(51) Int. Cl.
*H03M 7/34* (2006.01)
*H03M 7/38* (2006.01)

(52) U.S. Cl. .................. 341/51; 341/95; 341/106

(58) Field of Classification Search .......... 341/51, 341/95, 106
See application file for complete search history.

(56) References Cited

U.S. PATENT DOCUMENTS

| | | | | |
|---|---|---|---|---|
| 4,558,302 A | * | 12/1985 | Welch | 341/51 |
| 4,814,746 A | * | 3/1989 | Miller et al. | 341/95 |
| 5,642,112 A | * | 6/1997 | Cooper | 341/51 |
| 5,838,264 A | * | 11/1998 | Cooper | 341/106 |
| 6,624,762 B1 | * | 9/2003 | End, III | 341/51 |

* cited by examiner

*Primary Examiner*—Rexford Barnie
*Assistant Examiner*—Khai M. Nguyen
(74) *Attorney, Agent, or Firm*—Townsend and Townsend and Crew LLP

(57) ABSTRACT

Received data is compressed according to an algorithm, which is a modification of the conventional LZW algorithm. A limited number of hash values are formed, and a code memory is searched at locations corresponding to the hash values. If all of the locations contains a valid code, but none of them contains a valid code corresponding to a potential new code, a dummy code is created, and a counter, which indicates the number of codes created, is incremented. The algorithm can be implemented in parallel in hardware.

19 Claims, 7 Drawing Sheets

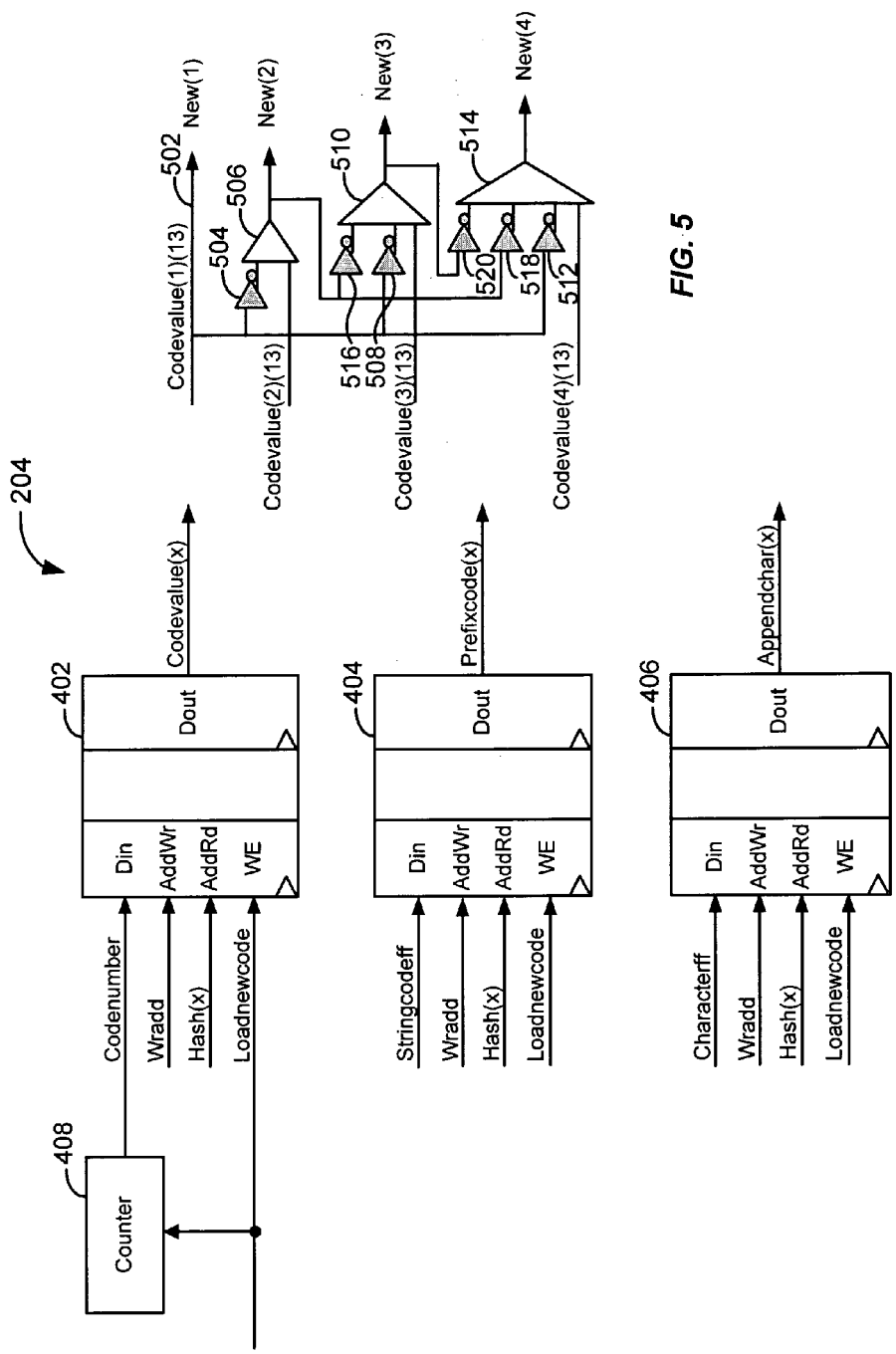

DATA COMPRESSION USING DUMMY CODES

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

TECHNICAL FIELD OF THE INVENTION

This invention relates to a method of data compression, and to a hardware device for performing the method.

BACKGROUND OF THE INVENTION

When transmitting data over a communications channel, or when storing data, it is often useful to be able to compress the data, in order to reduce the resources required to transmit or store the data. Data compression techniques rely on the fact that most useful data contains patterns, which can be exploited in order to reduce the amount of data required in order to represent the source data. For example, when the source data contains one or more repeated sequences of characters, each of these can be represented more efficiently by a particular code. Provided of course that the code contains fewer bits of data than the sequence of characters, this representation reduces the amount of data required to represent the source data.

One well known data compression is the LZW (Lempel-Ziv-Welch) data compression algorithm, which is described in U.S. Pat. No. 4,558,302 to Welch. In use of the LZW algorithm, a code dictionary is built up, based on the received data string. The received data can for example represent text made up of characters. Then, each individual character can be represented by one of the available codes, and the other available codes can be assigned to respective character strings, as they appear in the received text. For example, if the text is represented in the well known ASCII format with 256 available characters, one of the available codes is assigned to each of these characters. The number of available codes is then determined by the number of bits in each of the codes. For example, if 12 bit codes are used, there are $2^{12}$ (=4096) available codes, whereas if 13 bit codes are used, there are $2^{13}$ (=8192) available codes, and, if 14 bit codes are used, there are $2^{14}$ (=16384) available codes. Using longer codes therefore allows more codes to be assigned, but also increases the amount of data required to represent each code. The optimum number of available codes will depend on the properties of the data being compressed.

Having initially assigned 256 of the available codes to the 256 ASCII characters, a new code is allocated every time that a character string appears in the code for the first time. For each new code, the code dictionary stores the new code itself, a prefix code (which is a previously assigned code), and an append character (which is added to the character or character string represented by the prefix code to form the character string represented by the new code).

Thus, if the code 65 is assigned to the letter "a", and the letter "a" is the first character in the received character string, then a new code is allocated when the second character is received. A count is kept of the number of codes that have been allocated, so that a new code can be allocated a code number based on the number of previously allocated codes. For example, if the letter "b" is the second character in the received character string, at a time when 256 codes have previously been assigned to the 256 ASCII characters, then the new code is code 257, and it has the prefix code 65, and the append character is "b".

When the character string "ab" next appears in the received text, then a further new code is assigned. For example, if this occurs after 100 further new codes have been assigned, and the letter "s" immediately follows that second occurrence of the character string "ab", then the new code is code 357, the prefix code is code 257, and the append character is "s".

Thus, the code dictionary is built up as the text is received, until such time as all of the available codes have been assigned.

It is therefore apparent that, when each new character is received, it is necessary to search the code dictionary, in order to determine whether there exists an assigned code which should be used at that point. That is, in the example given above, when the character string "ab" appears in the received text for the second time, and the letter "s" immediately follows, it is necessary to search though the code dictionary, in order to determine whether there already exists a code with the prefix code 257, and the append character "s".

In order to allow the search of the code dictionary to be performed more quickly, one known technique uses a hash algorithm, although there are many other ways of performing the search. Using this known technique, a table is defined, having a size that is a prime number, and that is larger than the number of available codes. When a new code is assigned, it is stored in the table at an index defined by a hash function, derived from the prefix code and the append character. However, if it is determined that a code is already stored at this index (one of the properties of a hash algorithm being that each different output can be derived from many different inputs), the index is incremented according to some further hash function, and the new code is stored at that index, if possible. It will be appreciated that, as the table fills up, this process may need to be repeated multiple times in order to find a location at which the code can be stored.

When searching the code dictionary, therefore, to determine whether a code with a particular prefix code and append character has been assigned, the prefix code and the append character are combined using the hash function to form a hash value, and this is used as an index to search the table.

If, at this index, there is stored a code having the intended prefix code and append character, the search is complete. If no code is stored at this index, then a new code is created.

However, if there is a code stored at this index, having a different combination of prefix code and append character, it may still be the case that a code having the intended prefix code and append character is stored elsewhere in the table. In order to find this code, the further hash function mentioned above is used to increment the index, and determine an alternative location at which the code may be stored.

Again, as the table fills up, this process may need to be repeated multiple times in order either to find the code having the intended prefix code and append character, or to determine that no such code has been created and stored.

This places a limit on the speed at which data can be compressed, and moreover means that this speed will vary, depending on the nature of the data in the source data stream.

BRIEF SUMMARY OF THE INVENTION

According to an aspect of the present invention, a method of compressing received data, in the form of a string of characters, involves identifying a previously encoded data string comprising at least one character in said received data, as a potential new prefix string, and identifying a character immediately following said previously encoded data string as a potential new append character. A plurality of hash values are formed from said potential new prefix string and said potential new append character, and said plurality of hash values are used to identify a corresponding plurality of storage locations in a code memory, and to access said corresponding plurality of storage locations in said code memory. It is then determined whether said corresponding plurality of storage locations in said code memory contain valid code values and, if said corresponding plurality of storage locations contain valid codes, whether said corresponding plurality of storage locations contain valid codes comprising said potential new prefix string and said potential new append character.

If one of said corresponding plurality of storage locations contains a valid code comprising said potential new prefix string and said potential new append character, said potential new prefix string and said potential new append character are identified as an additional previously encoded data string. If none of said corresponding plurality of storage locations contains a valid code comprising said potential new prefix string and said potential new append character, and if one or more of said corresponding plurality of storage locations does not contain a valid code, a new code is created, comprising said potential new prefix string and said potential new append character, said new code is stored at a selected one of said one or more of said corresponding plurality of storage locations, and a counter which indicates the number of codes created is incremented. If all of said corresponding plurality of storage locations contains a valid code, but none of said corresponding plurality of storage locations contains a valid code comprising said potential new prefix string and said potential new append character, a dummy code is created, comprising said potential new prefix string and said potential new append character, and said counter which indicates the number of codes created is incremented.

This method has the advantage that it allows the data to be encoded at a speed which is largely predetermined. That is, the latency is largely guaranteed.

Further, although there is a small reduction in the coding efficiency, there is typically a large increase in speed.

According to a further aspect of the invention, there is provided a hardware device for performing the method.

BRIEF DESCRIPTION OF THE DRAWINGS

FIG. 4 is a more detailed block schematic diagram showing the structure of a block in the device of FIG. 2.

FIG. 5 is a more detailed block schematic diagram showing the structure of a block in the device of FIG. 2.

DETAILED DESCRIPTION OF THE INVENTION

Figure 1:
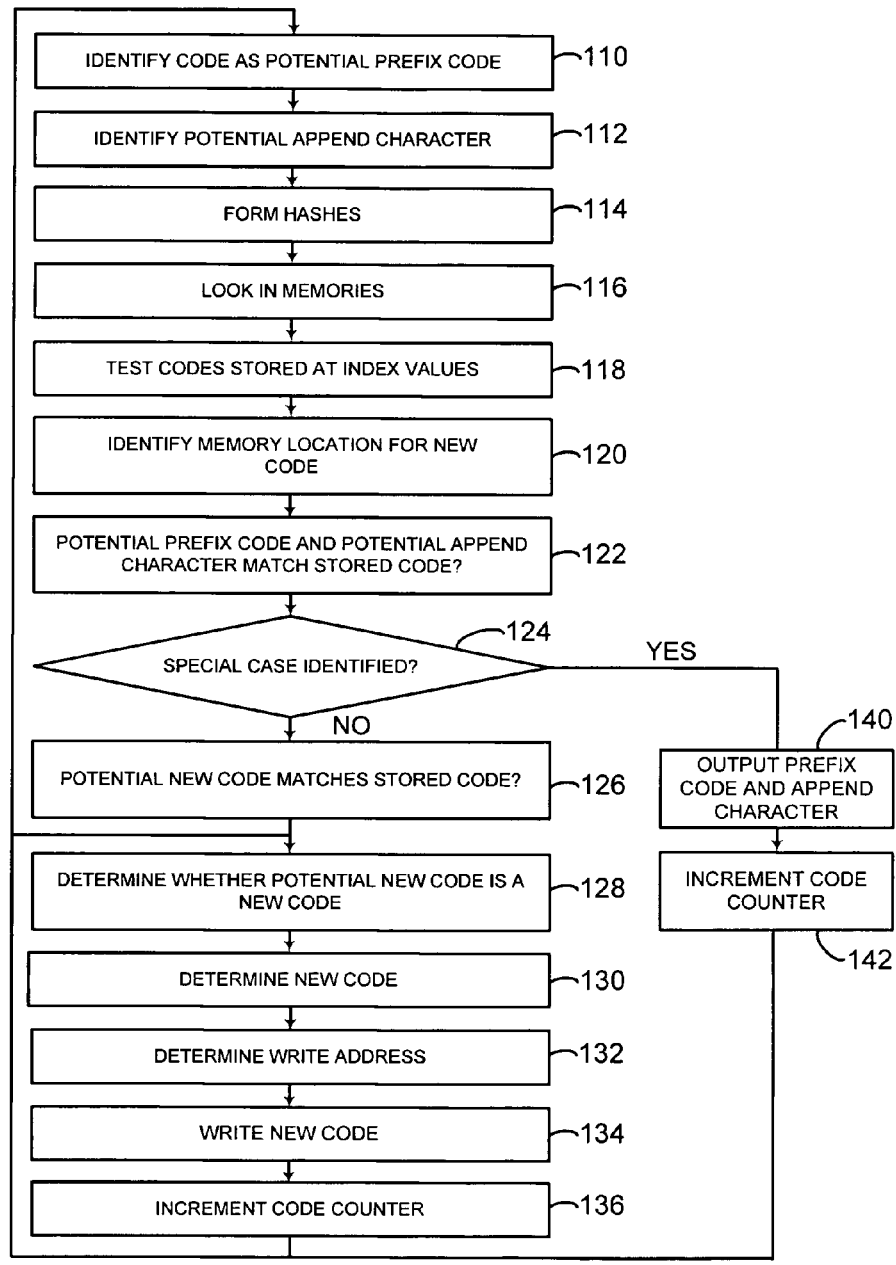
FIG. 1 is a flow chart, illustrating a method in accordance with an aspect of the invention.
Figure 2:
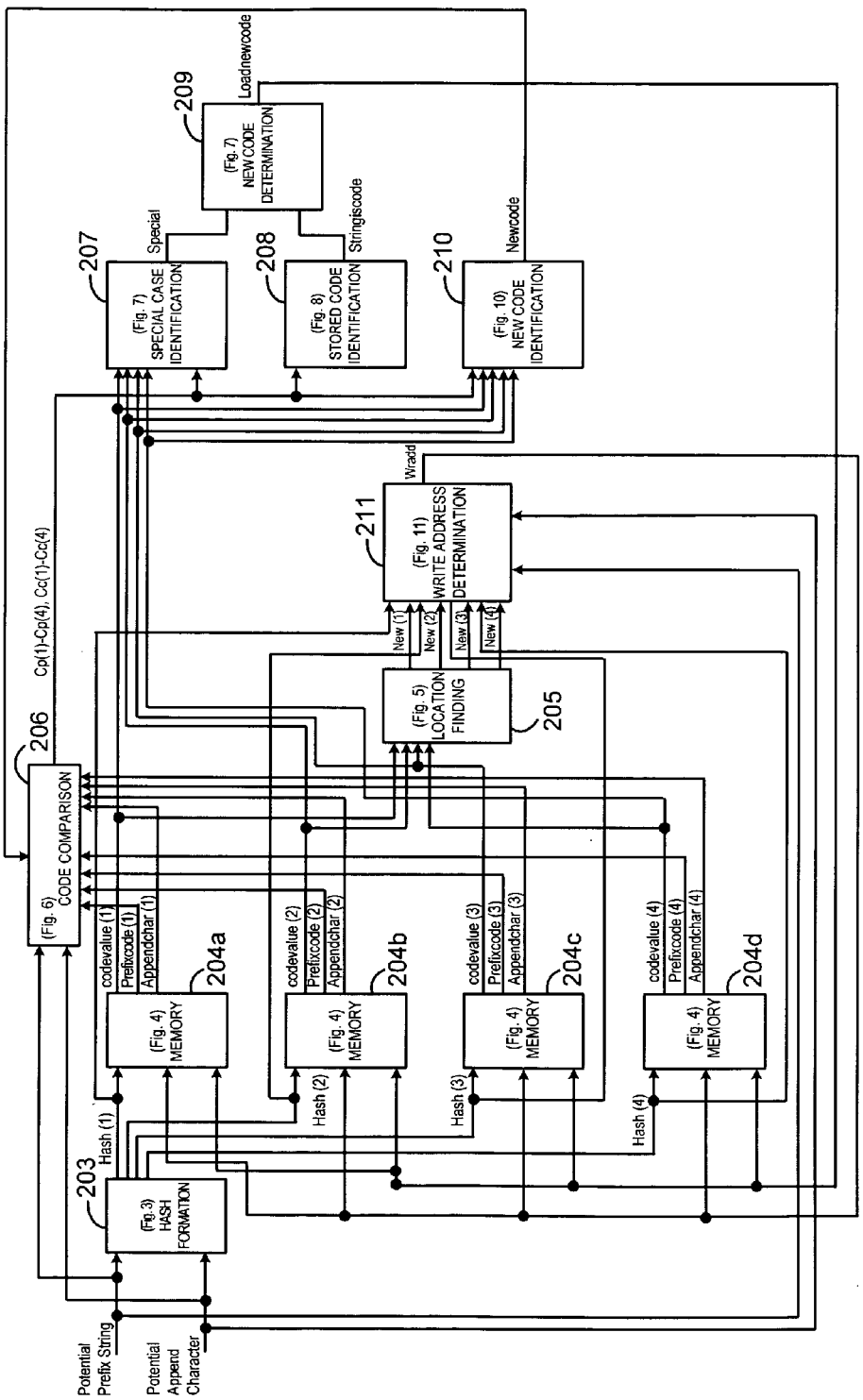
FIG. 2 is a block schematic diagram of a hardware device in accordance with an aspect of the invention for implementing the method of FIG. 1.

FIG. 1 is a flow chart, illustrating a method in accordance with a first aspect of the present invention. FIG. 2 is a block diagram, illustrating one possible form of a hardware implementation of the method illustrated in FIG. 1. For example, the hardware structure shown in FIG. 2 can be implemented in the programmable logic structure of an FPGA.

The method illustrated in FIG. 1 starts from the situation where the one or more characters received immediately previously have been identified as forming a string that is represented by an existing code. When the next character is received, it will then be necessary, according to the LZW algorithm, to determine whether there is also an existing code, which represents that string plus the next character. If this second code already exists, then the string will be its prefix code, and the next received character will be its append character.

At step 110 of the process, the previously received string is identified as a potential prefix code. Then, at step 112 of the process, the next character is received, and is therefore identified as a potential append character. Although the following steps are described sequentially, it will be appreciated from FIG. 2 that, when the method is performed in hardware as in this illustrated embodiment, many of the steps are performed essentially simultaneously. The hardware structure shown in FIG. 2 can conveniently be implemented in a FPGA, although other implementations are of course possible.

Figure 3:
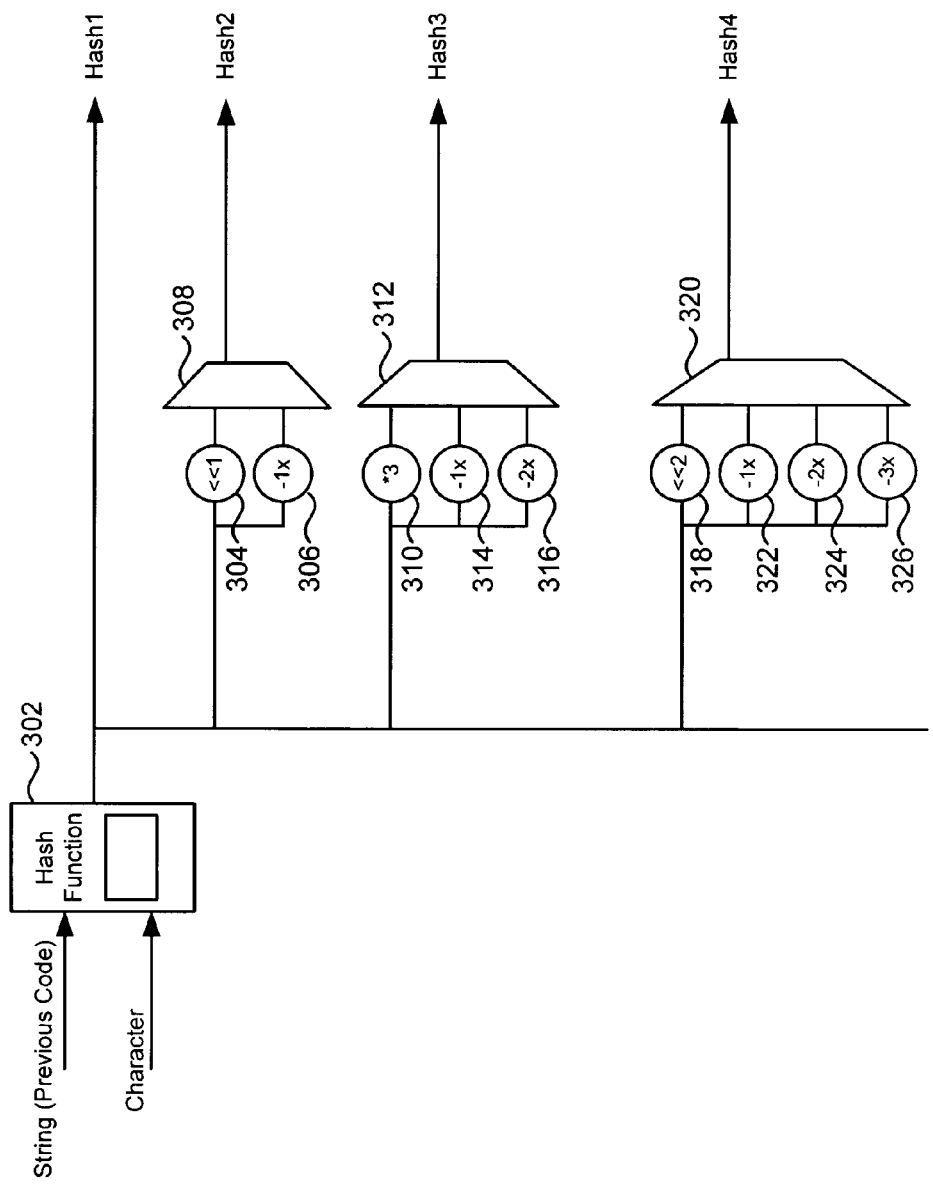
FIG. 3 is a more detailed block schematic diagram showing the structure of a block in the device of FIG. 2.

It is known that, if a code formed from the potential prefix code and the potential append character already exists, it will have been stored in a code table memory, at a location which is accessible using a hash value formed from the potential prefix code and the potential append character. In step 114, the possible hash values are formed. Specifically, referring to the hardware structure shown in FIG. 2, the potential prefix code and the potential append character are used as the inputs to a hash formation block 203, the structure of which is shown in more detail in FIG. 3.

Specifically, the previous string and the newly received are input to a hash function block 302, which forms a hash value according to some suitable hash function. Hash functions are well known to the person of ordinary skill in the art, and so a hash value can be formed by some suitable combination, for example, of applying binary bit shifts and applying an XOR function to the input values. A feature of a hash function is that each hash value can be obtained from multiple combinations of inputs.

The output of the hash function block 302 is treated as a first hash value Hash(1). At the same time, the output of the hash function block 302 is passed to a one bit binary shift block 304, which has the effect of multiplying its input by 2. This result is passed to a first multiplexer 308, such that, if it is a valid index value for the code table memory, it is treated as a second hash value Hash(2). However, if this result exceeds the size of the code table memory, the size of the code table memory is subtracted from the result in a subtraction block 306, and the result of this subtraction is passed by the first multiplexer 308, such that it is treated as the second hash value Hash(2).

Similarly, the output of the hash function block 302 is passed to a block 310, which has the effect of multiplying its input by 3. In practice, this may be achieved by adding the output of the hash function block 302 to itself after a one bit left shift (the one bit left shift having the effect of a multiplication by 2). This result is passed to a second multiplexer 312, such that, if it is a valid index value for the code table memory, it is treated as a third hash value Hash(3). However, if this result exceeds the size of the code table memory, the size of the code table memory is subtracted from the result in a subtraction block 314, and the result of this subtraction is passed to the second multiplexer 312. Then, if this result is a valid index value for the code table memory, it is treated as the third hash value Hash(3). However, if this result still exceeds the size of the code table memory, a value twice the size of the code table memory is subtracted from the original result in a subtraction block 316, and the result of this subtraction is passed by the second multiplexer 312, such that it is treated as the third hash value Hash(3).

Similarly again, the output of the hash function block 302 is passed to a two bit binary shift block 318, which has the effect of multiplying its input by 4. This result is passed to a third multiplexer 320, such that, if it is a valid index value for the code table memory, it is treated as a fourth hash value Hash(4). However, if this result exceeds the size of the code table memory, the size of the code table memory is subtracted from the result in a subtraction block 322, and the result of this subtraction is passed by the third multiplexer 320. Then, if this result is a valid index value for the code table memory, it is treated as the fourth hash value Hash(4). However, if this result still exceeds the size of the code table memory, a value twice the size of the code table memory is subtracted from the original result in a subtraction block 324, and, if this result is a valid index value for the code table memory, the result of this subtraction is passed by the third multiplexer 320, such that it is treated as the fourth hash value Hash(4). If this result still exceeds the size of the code table memory, a value three times the size of the code table memory is subtracted from the original result in a subtraction block 326, and the result of this subtraction is passed by the third multiplexer 320, such that it is treated as the fourth hash value Hash(4).

Thus, the hash formation block 203 forms four hash values in parallel, although the details of how this is done are purely illustrative. Further, in this illustrated embodiment, one hash value is formed, and the other three hash values are formed from it. However, in other embodiments of the invention, the four hash values can be formed independently, using separate hash algorithms. In other embodiments of the invention, a different number of hash values can be formed, although this is a compromise between the degree of data compression obtained and the amount of hardware resources used.

In step 116 of the process shown in FIG. 1, these four hash values are then used in parallel to look in the code table memory at the four indicated locations. In the embodiment of the invention shown in FIG. 2, the code table memory 204 is replicated four times, corresponding to the number of hash values generated. Thus, the first hash value Hash(1) is used as a read address (AddRd) to the first copy of the code table memory 204a, the second hash value Hash(2) is used as a read address (AddRd) to the second copy of the code table memory 204b, the third hash value Hash(3) is used as a read address (AddRd) to the third copy of the code table memory 204c, and the fourth hash value Hash(4) is used as a read address (AddRd) to the fourth copy of the code table memory 204d. In an alternative embodiment of the invention, a multi-ported memory can be used, and the four hash values can be used to access different respective locations in that memory.

FIG. 4 shows the structure of each of the four copies of the code table memory 204. Specifically, each copy of the code memory 204 is divided into three sections 402, 404, 406 so that they can be accessed in parallel. Thus, the relevant hash value Hash(x) is used to read a stored code value Codevalue(x) from the first section 402, and the corresponding prefix code Prefixcode(x) from the second section 404 and the corresponding append character Appendchar(x) from the third section 406. These stored values may indicate that the potential prefix code and the potential append character correspond to a previously stored code, or may indicate that another previously stored code has been stored at the memory location of interest because coincidentally it produced the same hash value, or may indicate that there is no previously stored code at that memory location.

In step 118 of the process shown in FIG. 1, the outputs from the four copies of the code table memory 204a, 204b, 204c, 204d are tested to determine whether there are previously stored codes at the four memory locations indicated by the four hash values Hash(1), Hash(2), Hash(3) and Hash(4). In this preferred embodiment of the invention, the codes are 12 bit codes. That is, there are 4096 available codes, namely the values 0, 1, . . . , 4095, expressed in binary. However, the codes are stored in the code memory 204 as 13 bit values, and, whenever the core is reset, all of the stored code values are initialized to the value 4096, which is expressed in binary as a 1" followed by twelve "0".

FIG. 5 shows the structure of the location finding block 205, which is used in step 118 to determine the first of the four memory locations, indicated by the four hash values Hash(1), Hash(2), Hash(3) and Hash(4), at which no valid code is stored. Specifically, the stored code values Codevalue(1), Codevalue(2), Codevalue(3) and, Codevalue(4) are output from the respective first sections 402 of the four memories 204a, 204b, 204c and 204d, and their respective thirteenth least significant bits, Codevalue(1)(13), Codevalue(2)(13), Codevalue(3)(13) and Codevalue(4)(13) are considered by the structure shown in FIG. 5. As mentioned above, the thirteenth least significant bit of a stored code value will be high, if and only if that no new code value has been stored since the code value was initialized, that is, if and only if that location does not contain a valid code value.

Thus, in FIG. 5, Codevalue(1)(13) is supplied to a first output 502 as a first output value New(1), and is also supplied through a first inverter 504 to a first AND gate 506;

through a second inverter 508 to a second AND gate 510; and through a third inverter 512 to a third AND gate 514.

Codevalue(2)(13) is supplied to a second input of the first AND gate 506. The output New(2) of the first AND gate 506 is supplied through a fourth inverter 516 to a second input of the second AND gate 510. Codevalue(3)(13) is supplied to a third input of the second AND gate 510.

The output New(2) of the first AND gate 506 is also supplied through a fifth inverter 518 to a second input of the third AND gate 514. The output New(3) of the second AND gate 510 is supplied through a sixth inverter 520 to a third input of the third AND gate 514. Codevalue(4)(13) is supplied to a fourth input of the third AND gate 514.

Thus, if Codevalue(1)(13) is a binary "1", the first output value New(1) is high, and the other output values are all kept low, because the value of New(1) is supplied through respective inverters to the AND gates which supply those outputs.

If Codevalue(1)(13) is a binary "0", the first output value New(1) is low, and then, if Codevalue(2)(13) is a binary "1", the second output value New(2) is high, while the third and fourth output values are all kept low, because the value of New(2) is supplied through respective inverters to the AND gates which supply those outputs.

If Codevalue(1)(13) and Codevalue(2)(13) are both binary "0"s, the first and second output values New(1) and New(2) are both low, and then, if Codevalue(3)(13) is a binary "1", the third output value New(3) is high, while the fourth output value is kept low, because the value of New(3) is supplied through the inverter 520 to the AND gate 514.

If Codevalue(1)(13), Codevalue(2)(13) and Codevalue(3)(13) are all binary "0"s, the first, second and third output values New(1), New(2) and New(3) are all low, and then, if Codevalue(4)(13) is a binary "1", the fourth output value New(4) is high.

Thus, there is a binary "1" signal output on the output line which corresponds to the first memory location that does not contain a valid code and, in step 120 of the process shown in FIG. 1, this is identified as the memory location at which a new code will be written, if this is found to be necessary.

In step 122, it is tested whether the potential prefix code and the potential append character of the potential new code, identified at steps 110 and 112 of the process, match the prefix code and the append character any of the codes stored in the code table memories 204, at the locations which are accessible using the four hash values discussed above.

Figure 6:
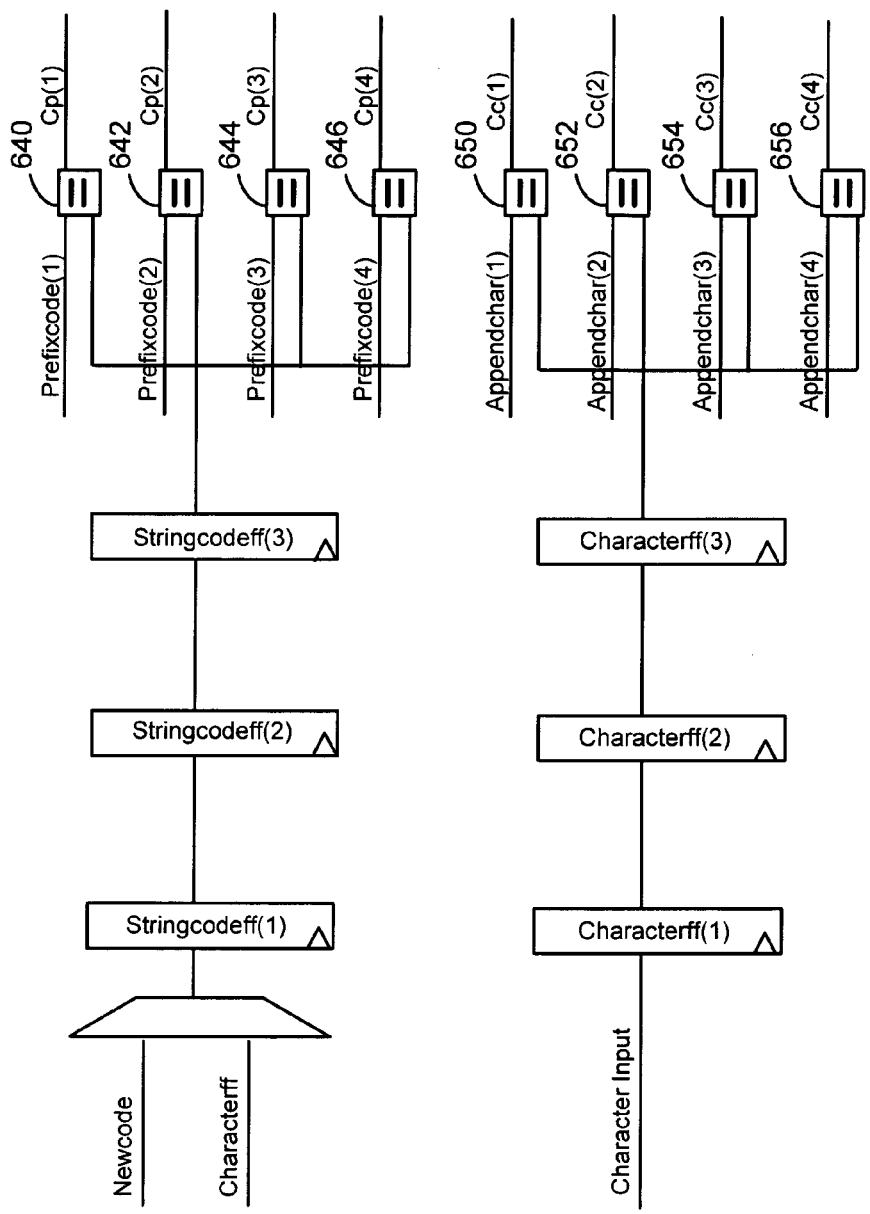
FIG. 6 is a more detailed block schematic diagram showing the structure of a block in the device of FIG. 2.

Thus, the potential prefix code and the potential append character are supplied to inputs of a code comparison block 206, the structure of which is shown in more detail in FIG. 6.

Specifically, there are four comparators 640, 642, 644, 646, which receive the values of the respective prefix codes Prefixcode(1), Prefixcode(2), Prefixcode(3), Prefixcode(4) from the respective second sections 404 of the memory blocks 204*a*, 204*b*, 204*c* and 204*d*, and also receive the potential prefix code. Each of these comparators 640, 642, 644, 646 is adapted to provide a high level signal Cp(1), Cp(2), Cp(3), Cp(4) if the potential prefix code matches the corresponding stored value of Prefixcode(x). Similarly, there are four comparators 650, 652, 654, 656, which receive the values of the respective append characters Appendchar(1), Appendchar(2), Appendchar(3), Appendchar(4) from the respective third sections 406 of the memory blocks 204*a*, 204*b*, 204*c* and 204*d*, and also receive the potential append character. Each of these comparators 650, 652, 654, 656 is adapted to provide a high level signal Cc(1), Cc(2), Cc(3), Cc(4) if the potential append character matches the corresponding stored value of Appendchar(x).

In order to initialize the core when the process is first started, the first received character is loaded into Stringcodeff, while the second received character is loaded into Characterff.

Next, in step 124, it is determined whether a special case applies, in accordance with a conventional implementation of the LZW algorithm, it is necessary to continue searching through the code table until such time as the search finds either a code which is made up of the potential prefix code and the potential append character or a location at which no valid code is stored. However, in accordance with the preferred embodiment of the present invention, only the four locations identified by the four hash values Hash(1), Hash(2), Hash(3) and Hash(4) are searched. If searching at those four locations does not identify either a location at which there is stored a code made up of the potential prefix code and the potential append character or a location at which no valid code is stored, then this is considered to be a special case.

Figures 7, 8, 9:
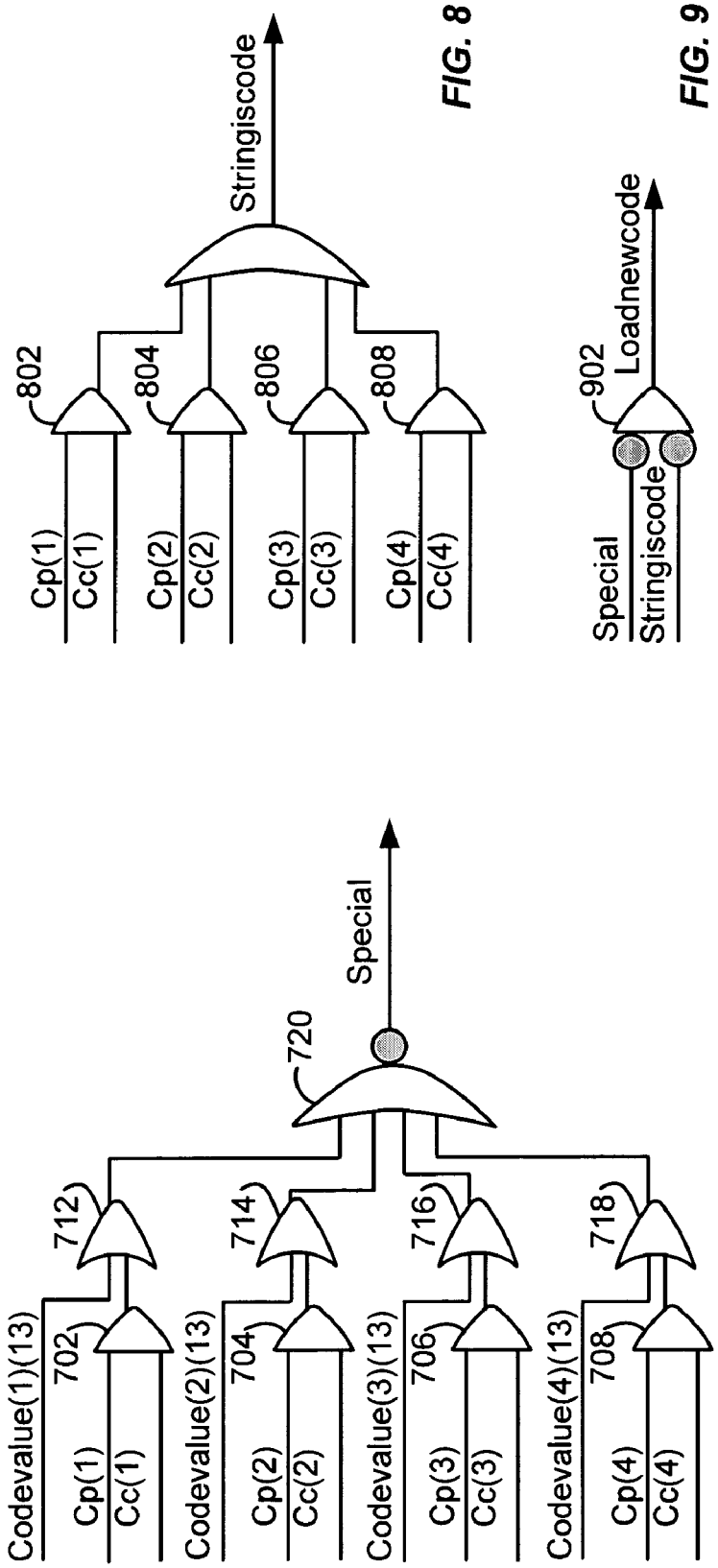
FIG. 7 is a more detailed block schematic diagram showing the structure of a block in the device of FIG. 2.
FIG. 8 is a more detailed block schematic diagram showing the structure of a block in the device of FIG. 2.
FIG. 9 is a more detailed block schematic diagram showing the structure of a block in the device of FIG. 2.

In order to determine whether a special case applies, the signals Cp(1), Cp(2), Cp(3), Cp(4) and Cc(1), Cc(2), Cc(3), Cc(4) are supplied to a special case identification block 207, which is shown in more detail in FIG. 7. Also supplied to the special case identification block 207 are the thirteenth least significant bits Codevalue(1)(13), Codevalue(2)(13), Codevalue(3)(13) and Codevalue(4)(13) of the four stored code values output from the respective first sections 402 of the four memories 204*a*, 204*b*, 204*c* and 204*d*.

The signals Cp(1) and Cc(1) are applied to a first AND gate 702, the signals Cp(2) and Cc(2) are applied to a second AND gate 704, the signals Cp(3) and Cc(3) are applied to a third AND gate 706, and the signals Cp(4) and Cc(4) are applied to a fourth AND gate 708. The signal Codevalue(1)(13) and the output of the first AND gate 702 are applied to a first OR gate 712, the signal Codevalue(2)(13) and the output of the second AND gate 704 are applied to a second OR gate 714, the signal Codevalue(3)(13) and the output of the third AND gate 706 are applied to a third OR gate 716, the signal Codevalue(4)(13) and the output of the fourth AND gate 708 are applied to a fourth OR gate 718. The outputs of the four OR gates 712, 714, 716, 718 are applied to a NOR gate 720.

If the potential new code matches any of the stored codes, then the corresponding values of Cp(x) and Cc(x) are both high, and the corresponding one of the AND gates 702, 704, 706 and 708 produces a high output. In that case, the corresponding one of the OR gates 712, 714, 716 and 718 produces a high output, and so the NOR gate 720 produces a low output.

If the potential new code does not match any of the stored codes, then the outputs of the OR gates 712, 714, 716 and 718 depend on the values of their respective Codevalue(x)(13) inputs. If anyone of these Codevalue(x)(13) inputs is high, indicating that there is a location at which no valid code has yet been stored, the corresponding one of the OR gates 712, 714, 716 and 718 produces a high output, and so the NOR gate 720 produces a low output.

Thus, the NOR gate 720 produces a high output, indicating a special case, only if the potential new code does not match any of the stored codes, and if there is no location at which no valid code has yet been stored.

The action to be taken when a special case is identified will be described in more detail below.

However, it is determined in step 126 whether there is not a special case, in that the potential new code, made up of the potential prefix code and the potential append character identified at steps 110 and 112 of the process, matches one of the codes stored in the code table memories 204, at the locations which are accessible using the four hash values discussed above.

For this purpose, the signals Cp(1), Cp(2), Cp(3), Cp(4) and Cc(1), Cc(2), Cc(3), Cc(4) are supplied to a stored code identification block 208, which is shown in more detail in FIG. 8.

The signals Cp(1) and Cc(1) are applied to a first AND gate 802, the signals Cp(2) and Cc(2) are applied to a second AND gate 804, the signals Cp(3) and Cc(3) are applied to a third AND gate 806, and the signals Cp(4) and Cc(4) are applied to a fourth AND gate 808. The outputs of the four AND gates 802, 804, 806, 808 are applied to an OR gate 810. If the potential new code matches any of the stored codes, then the corresponding values of Cp(x) and Cc(x) are both high, and the corresponding one of the AND gates 802, 804, 806 and 808 produces a high output. In that case, the OR gate 810 produces a high Stringiscode output, indicating that the potential new code has in fact been previously stored as a code in the code memory 204. In that case, it is determined that the potential new code is in fact not a new code, and the process can return to step 110 and start again, with that code now acting as a potential prefix code, and with a new character being input.

At the same time, it is determined in step 128 whether the potential new code is in fact a new code. In the illustrated hardware implementation, this is achieved by passing the outputs of the special case identification block 207 and the stored code identification block 208 to a new code determination block 209, which is shown in more detail in FIG. 9.

Specifically, the outputs of the special case identification block 207 and the stored code identification block 208 are passed, inverted, to respective inputs of an AND gate 902. Thus, if a special case is not identified, and if it is not found that the potential new code has been previously stored, it can be determined that the potential new code should be stored as a new code, and the new code identification block 209 outputs a high Loadnewcode output.

The Loadnewcode signal is then fed back to the write enable (WE) inputs of each of the three sections 402, 404, 406 in each of the four copies 204a, 204b, 204c, 204d of the code table memory.

In case it is determined in step 128 that the potential new code is in fact a new code which should be stored in the code memory 204, the new code is identified in step 130.

Figure 10:
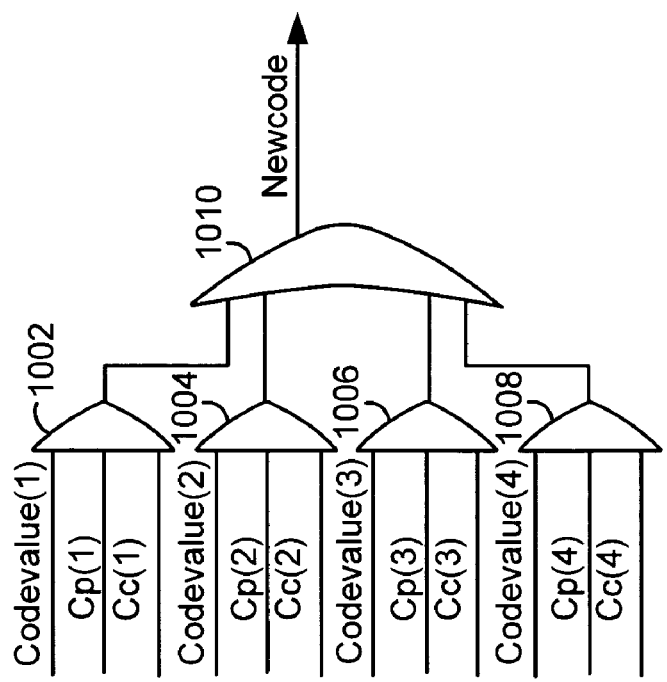
FIG. 10 is a more detailed block schematic diagram showing the structure of a block in the device of FIG. 2.

More specifically, this step is performed in a new code identification block 290 of the hardware implementation shown in FIG. 2, with the new code identification block 210 being shown in more detail in FIG. 10. The stored code values Codevalue(1), Codevalue(2), Codevalue(3) and, Codevalue(4), output from the respective first sections 402 of the four memories 204x, 204b, 204c and 204d, are applied to respective first inputs of four AND gates 1002, 1004, 1006, 1008. In addition, signals Cp(1) and Cc(1) are applied to the first AND gate 1002, the signals Cp(2) and Cc(2) are applied to the second AND gate 1004, the signals Cp(3) and Cc(3) are applied to the third AND gate 1006, and the signals Cp(4) and Cc(4) are applied to the fourth AND gate 1008. The outputs of the four AND gates 1002, 1004, 1006, 1008 are applied to an OR gate 1010. If the potential new code matches any of the stored codes, then the corresponding values of Cp(x) and Cc(x) are both high. In that case, the OR gate 1010 produces an output, Newcode, which matches the corresponding stored code value Codevalue(x). The output, Newcode, is then loaded into the code comparison block 206 as the current code value for Stringcodeff.

Figure 11:
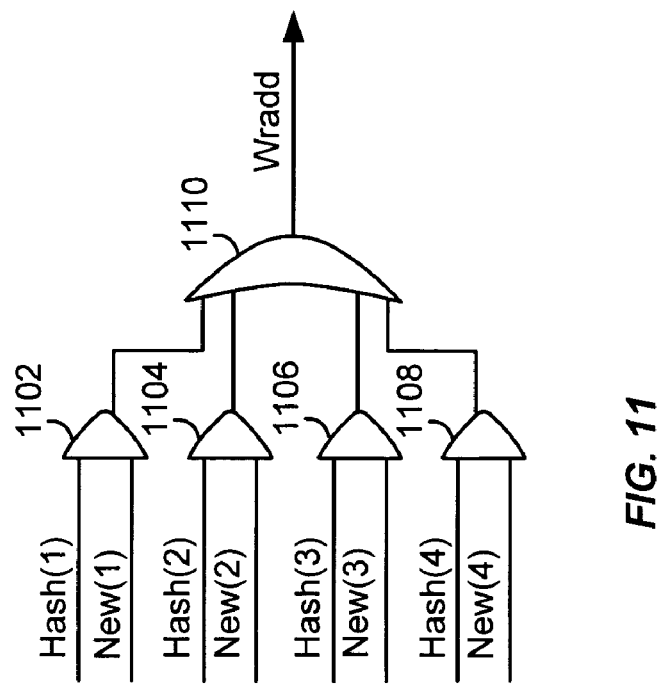
FIG. 11 is a more detailed block schematic diagram showing the structure of a block in the device of FIG. 2.

In step 132, the address (AddWr), to which the new code should be written, is determined. More specifically, this step is performed in a write address determination block 211 of the hardware implementation shown in FIG. 2, with the write address determination block 211 being shown in more detail in FIG. 11.

The four hash values Hash(1), Hash(2), Hash(3) and Hash(4), output from the hash formation block 203, are applied to respective first inputs of four AND gates 1102, 1104, 1106, 1108. At the same time, the outputs New(1), New(2), New(3) and New(4) from the location finding block 205 are applied to respective second inputs of the four AND gates 1102, 1104, 1106, 1108. The outputs of the four AND gates 1102, 1104, 1106, 1108 are applied to an OR gate 1110.

The logic of the write address determination block 211 operates such that the output signal Wradd is equal to the value of Hash(x) corresponding to the high value of New(x). Thus, the location finding block 205 identified which of the four hash values Hash(1), Hash(2), Hash(3) and Hash(4) had found the first free address, and the write address determination block 211 outputs that hash value. This output signal Wradd is then fed back to the write address (AddWr) inputs of each of the three sections 402, 404, 406 in each of the four copies 204a, 204b, 204c, 204d of the code table memory. If the Loadnewcode signal, output from the new code determination block 209 and fed back to the corresponding write enable (WE) inputs is high, then data is written to the memory blocks 204 at the indicated write address.

The memory 204 contains a code counter 408, which counts the number of codes that have been allocated. Thus, in step 134 of the process, the code number, incremented by one since the last new code was written, is stored in the first section 402, the new prefix code is stored in the second section 404, and the append character is stored in the third section 406. Each of the copies of the code table memory 204a, 204b, 204c, 204d can contain a separate code counter 408, or a single code counter can be connected to each of the copies of the code table memory.

In step 136 of the process, the code counter is then incremented, and the process returns to step 110 to await a new input character.

As is conventional, the code counter is incremented until it is found that it has reached the number of available codes, that is, 4095 in this illustrated case where 12-bit codes are used. From that point, as in the conventional LZW encoding process, no new codes can be added.

As mentioned above, if it is found at step 124 that the potential new code does not match any of the stored codes, and if it is also found that there is no location (amongst the four locations identified by the four hash values) at which no valid code has yet been stored, the NOR gate 720 produces a high output, indicating a special case.

In that special case, in the preferred embodiments of the invention, a dummy code is created. Firstly, in step 140 of the process shown in FIG. 1, two existing codewords, representing the potential prefix code and the potential append character are output. If it is the case that a more extensive search of the code memory could have found that the potential new code was previously stored as an existing code, then outputting these two existing codewords will result in a reduced compression ratio. However, for many users, the disadvantage of this reduced compression ratio will be more than offset by the increase in processing speed which can be achieved in accordance with the invention.

Then, in step 142 of the process, the code counter is incremented, and the process returns to step 110 to await a new input character.

However, even though the code counter is incremented, there is no change to any of the stored codes. Effectively, that code number is empty, and is never used. Thus, if the same input sequence were to be received again subsequently, the same processing steps would be performed again, and a new dummy code would be generated.

Therefore, as discussed above, the data can be compressed at a higher speed than using a true LZW compression, although with a slightly lower compression ratio. Further, the invention has the advantage that the latency can be essentially guaranteed, since the processing steps taken in response to each received character are essentially the same.

The method according to the present invention has the further advantage that it generates output compressed data, which is in LZW form, since all of the output data is made up of codes in LZW form. The data can therefore be compressed by a true LZW decompressor, without requiring any modification.

Although the method according to the invention has been described in connection with an embodiment in which it is performed in a parallel hardware architecture, the invention could equally be performed by means of serial processing, or could be implemented in software rather than hardware.

What is claimed is:

1. A method of compressing received data, the received data comprising a string of characters, the method comprising:

identifying a previously encoded data string comprising at least one character in said received data, as a potential new prefix string;

identifying a character immediately following said previously encoded data string as a potential new append character;

forming a plurality of hash values from said potential new prefix string and said potential new append character;

using said plurality of hash values to identify a corresponding plurality of storage locations in a code memory, and to access said corresponding plurality of storage locations in said code memory;

determining whether said corresponding plurality of storage locations in said code memory contain valid code values and, if said corresponding plurality of storage locations contain valid codes, determining whether said corresponding plurality of storage locations contain valid codes comprising said potential new prefix string and said potential new append character;

if one of said corresponding plurality of storage locations contains a valid code comprising said potential new prefix string and said potential new append character, identifying said potential new prefix string and said potential new append character as an additional previously encoded data string;

if none of said corresponding plurality of storage locations contains a valid code comprising said potential new prefix string and said potential new append character, and if one or more of said corresponding plurality of storage locations does not contain a valid code, creating a new code comprising said potential new prefix string and said potential new append character, storing said new code at a selected one of said one or more of said corresponding plurality of storage locations, and incrementing a counter which indicates the number of codes created; and if all of said corresponding plurality of storage locations contains a valid code, but none of said corresponding plurality of storage locations contains a valid code comprising said potential new prefix string and said potential new append character, creating a dummy code comprising said potential new prefix string and said potential new append character, and incrementing said counter which indicates the number of codes created.

2. A method as claimed in claim 1, comprising accessing said corresponding plurality of storage locations in said code memory in parallel.

3. A method as claimed in claim 1, comprising:
providing multiple copies of said code memory; and
accessing each of said corresponding plurality of storage locations in a respective one of said copies of code memory in parallel.

4. A method as claimed in claim 3, wherein:
if none of said corresponding plurality of storage locations contains a valid code comprising said potential new prefix string and said potential new append character, and if one or more of said corresponding plurality of storage locations does not contain a valid code, said step of storing said new code comprises storing a copy of said new code at the selected one of said one or more of said corresponding plurality of storage locations in each of said multiple copies of said code memory.

5. A method as claimed in claim 1, comprising:
providing said code memory as a multi-port memory; and
accessing each of said corresponding plurality of storage locations in said multi-port memory in parallel.

6. A method as claimed in claim 1, wherein said plurality of hash values comprises a predetermined number of hash values.

7. A method as claimed in claim 6, wherein said plurality of hash values comprises four hash values.

8. A method as claimed in claim 1, comprising forming a first of said plurality of hash values according to a predetermined hash function, and forming others of said plurality of hash values from said first of said plurality of hash values.

9. A method as claimed in claim 1, comprising repeating steps of the method and incrementing said counter until said counter indicates that a predetermined number of codes have been created.

10. A method as claimed in claim 1, wherein said step of creating a dummy code comprises outputting codes indicative of said potential new prefix string and said potential new append character, without storing a new code in said code memory.

11. A device for compressing received data, the received data comprising a string of characters, the device comprising:

logic for identifying a previously encoded data string comprising at least one character in said received data, as a potential new prefix string;

logic for identifying a character immediately following said previously encoded data string as a potential new append character;

a hash generator for forming a plurality of hash values from said potential new prefix string and said potential new append character;

a code memory, comprising a plurality of storage locations, for storing a corresponding plurality of codes, wherein each of said plurality of hash values accesses a corresponding storage location in said code memory; and logic circuitry, for determining whether said corresponding plurality of storage locations in said code memory contain valid code values and, if said corresponding plurality of storage locations contain valid codes, determining whether said corresponding plurality of storage locations contain valid codes comprising said potential new prefix string and said potential new append character, wherein, if one of said corresponding plurality of storage locations contains a valid code comprising said potential new prefix string and said potential new append character, said logic circuitry identifies said potential new prefix string and said potential new append character as an additional previously encoded data string;

wherein, if none of said corresponding plurality of storage locations contains a valid code comprising said potential new prefix string and said potential new append character, and if one or more of said corresponding plurality of storage locations does not contain a valid code, said logic circuitry creates a new code comprising said potential new prefix string and said potential new append character, stores said new code at a selected one of said one or more of said corresponding plurality of storage locations, and increments a counter which indicates the number of codes created; and wherein, if all of said corresponding plurality of storage locations contains a valid code, but none of said corresponding plurality of storage locations contains a valid code comprising said potential new prefix string and said potential new append character, said logic circuitry creates a dummy code comprising said potential new prefix string and said potential new append character, and increments said counter which indicates the number of codes created.

12. A device as claimed in claim 11, comprising:
multiple copies of said code memory; and
wherein each of said hash values accesses a respective one of said corresponding plurality of storage locations in a respective one of said copies of code memory in parallel.

13. A device as claimed in claim 12, wherein:
if none of said corresponding plurality of storage locations contains a valid code comprising said potential new prefix string and said potential new append character, and if one or more of said corresponding plurality of storage locations does not contain a valid code, said logic circuitry stores a copy of said new code at the selected one of said one or more of said corresponding plurality of storage locations in each of said multiple copies of said code memory.

14. A device as claimed in claim 11, wherein:
said code memory is a multi-port memory; and
wherein each of said hash values accesses a respective one of said corresponding plurality of storage locations in said multi-port memory in parallel.

15. A device as claimed in claim 11, wherein said plurality of hash values comprises a predetermined number of hash values.

16. A device as claimed in claim 15, wherein said plurality of hash values comprises four hash values.

17. A device as claimed in claim 11, wherein said hash generator forms a first of said plurality of hash values according to a predetermined hash function, and forms others of said plurality of hash values from said first of said plurality of hash values.

18. A device as claimed in claim 11, wherein said code counter is incremented until said counter indicates that a predetermined number of codes have been created.

19. A device as claimed in claim 11, wherein, if all of said corresponding plurality of storage locations contains a valid code, but none of said corresponding plurality of storage locations contains a valid code comprising said potential new prefix string and said potential new append character, said logic circuitry additionally outputs separate codes representing said potential new prefix string and said potential new append character.

* * * * *